United States Patent
Negishi

(10) Patent No.: US 8,147,287 B2
(45) Date of Patent: Apr. 3, 2012

(54) ORGANIC EL ELEMENT AND A METHOD FOR MANUFACTURING THE ORGANIC EL ELEMENT

(75) Inventor: Toshio Negishi, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 12/731,385

(22) Filed: Mar. 25, 2010

(65) Prior Publication Data

US 2010/0176391 A1 Jul. 15, 2010

Related U.S. Application Data

(63) Continuation of application No. PCT/JP2008/067450, filed on Sep. 26, 2008.

(30) Foreign Application Priority Data

Oct. 2, 2007 (JP) ................................. 2007-258773

(51) Int. Cl.
*H01J 9/00* (2006.01)
(52) U.S. Cl. ................ 445/24; 445/10; 445/11; 445/13; 427/66
(58) Field of Classification Search .................. None
See application file for complete search history.

(56) References Cited

U.S. PATENT DOCUMENTS

| | | | | |
|---|---|---|---|---|
| 6,768,260 B2 * | 7/2004 | Fukunaga et al. | ............ | 313/506 |
| 7,029,767 B2 | 4/2006 | Nakamata | | |
| 2002/0086180 A1 * | 7/2002 | Seo et al. | ...................... | 428/690 |
| 2006/0115673 A1 | 6/2006 | Li | | |
| 2009/0102358 A1 | 4/2009 | Shimoji | | |
| 2009/0273280 A1 * | 11/2009 | Seo et al. | ...................... | 313/504 |
| 2011/0133636 A1 * | 6/2011 | Matsuo et al. | ................ | 313/504 |

FOREIGN PATENT DOCUMENTS

| | | |
|---|---|---|
| JP | 10-140344 | 5/1998 |
| JP | 2000-113976 | 4/2000 |
| JP | 2001-217074 A1 | 8/2001 |
| JP | 2004-22176 A1 | 1/2004 |
| JP | 2004-327414 A1 | 11/2004 |
| JP | 2005-332803 A1 | 12/2005 |

(Continued)

OTHER PUBLICATIONS

International Search Report for International Application No. PCT/JP2008/067450 dated Jan. 6, 2009.

(Continued)

*Primary Examiner* — Ashok Patel
(74) *Attorney, Agent, or Firm* — Kratz, Quintos & Hanson, LLP

(57) ABSTRACT

A dense cathode electrode layer having a step coverage is to be formed on an electron injection layer. The electron injection layer in which fine particles of an electron injection material is dispersed in an organic thin film having an electron transport property is formed by vapor co-depositing the electron transport material and the electron injection material; and a cathode electrode layer made of an alloy layer of MgAg is formed by a sputtering method. Since lower portions of the fine particles of the electron injection material dispersed in the surface of the organic thin film are buried in the organic thin film, the electron injection particles are not peeled off even if sputtering particles collide with the electron injection particles, and the upper portions are in contact with the cathode electrode layer formed by sputtering particles.

5 Claims, 9 Drawing Sheets

FOREIGN PATENT DOCUMENTS

| | | |
|---|---|---|
| JP | 2005-340225 A1 | 12/2005 |
| JP | 2006-66553 A1 | 3/2006 |
| JP | 2006-157022 A1 | 6/2006 |
| JP | 2006-344497 A1 | 12/2006 |
| JP | 2007-157349 A1 | 6/2007 |

OTHER PUBLICATIONS

PCT International Preliminary Report on Patentability (PCT Chapter I) dated May 4, 2010.

* cited by examiner

ORGANIC EL ELEMENT AND A METHOD FOR MANUFACTURING THE ORGANIC EL ELEMENT

This application is a continuation application of International Application No. PCT/JP2008/067450, filed Sep. 26, 2008, which claims priority to Japan Patent Application No. 2007-258773, filed Oct. 2, 2007. The entire disclosures of the prior applications are herein incorporated by reference in their entireties.

TECHNICAL FIELD

The present invention generally relates to a technical field of the organic EL elements; and the invention more particularly relates to a technology for manufacturing a display device suitable for a top-emission-type organic EL element.

BACKGROUND OF THE INVENTION

A conventional organic EL element is shown by a reference numeral 101 in FIG. 6.

This organic EL element 101 possesses a substrate 102. An anode electrode layer 103, a hole injection layer 104, an organic light-emitting portion 105 and an electron injection layer 106 and a cathode electrode layer 107 are formed on the substrate 102 in this order.

When a positive voltage and a negative voltage are applied to the anode electrode layer 103 and the cathode electrode layer 107, holes injected into the organic light-emitting portion 105 from the hole injection layer 104 and electrons injected into the organic light-emitting portion 105 from the electron injection layer 106 are recombined inside of the organic light-emitting portion 105; and the organic light-emitting portion 105 emits a light.

In case of the top-emission-type organic EL element, the anode electrode layer 103 has a high reflectance, and the cathode electrode layer 107 is composed of a material having a high transmission. Thus, the light radiated toward the cathode electrode layer 107 from the organic light-emitting portion 105 is emitted outside the organic EL element 101 through the cathode electrode layer 107, while the light radiated in a direction of the anode electrode 103 is reflected by the anode electrode layer 103, and is emitted outside through the organic light-emitting portion 105 and the cathode electrode layer 107.

Therefore, in the case of the top-emission-type organic EL element, it is required that the cathode electrode layer 107 not only has a high transmission but also a low resistivity, which is needed to pass a current uniformly in a plane so as to uniformly emit the light in the plane.

As an electrode material which satisfies such requirements, there is a thin film of an MgAg alloy. A cathode electrode layer 107 composed of the MgAg alloy is formed by emitting an Mg vapor and an Ag vapor separate from an Mg vapor generating source and an Ag vapor generating source according to a vapor deposition method and bringing them together to a surface of an electron injection layer 106.

However, although omitted in FIG. 6, since there are actually steps on a surface of the organic EL element 101 and the vapor deposition method exhibits a poor step coverage, there is a problem in that disconnection is formed in the cathode electrode layer 107 at shadowed portions around the projected portions of the steps.

On the other hand, when an MgAg thin film is to be formed by sputtering an MgAg target, the electron injection layer 106 is subjected to an argon plasma.

The electron injection layer 106 is a very thin film made of an electron injection material (such as, Li (lithium), LiF (lithium fluoride), cesium fluoride CsF), so that there is a problem in that when the electron injection layer is exposed to the plasma, it is sputtered and disappears from on the organic light-emitting portion 105.

Organic EL elements using MgAg thin films are described in, for example, the following documents:
Patent Document 1: JP-A 2006-344497,
Patent Document 2: JP-A 2004-327414,
Patent Document 3: JP-A 2001-217074.

SUMMARY OF THE INVENTION

The present invention, which has been made so as to solve the problems of the above-discussed conventional art, provides a technology capable of forming an MgAg film on an electron injection layer by a sputtering method.

In order to solve the above-discussed problems, the present invention is directed to an organic EL element having an anode electrode layer, a hole injection layer arranged on the anode electrode layer, an organic light-emitting portion arranged on the hole injection layer, an electron injection layer arranged on the organic light-emitting portion, and a cathode electrode layer arranged on the electron injection layer. In the present invention, when a voltage is applied between the anode electrode layer and the cathode electrode layer and holes and electrons are injected into the organic light-emitting portion from the hole injection layer and the electron injection layer, the organic light-emitting portion emits light, and a luminescent light is emitted outside. The present invention is directed to the organic EL element in which the electron injection layer includes an organic thin film having an electron transport property and fine particles of an electron injection material dispersed in the organic thin film.

Further, the present is directed to the organic EL element, in which the cathode electrode layer contains Mg and Ag.

Further, the present invention is directed to the organic EL element, in which the cathode electrode layer is a layer of an alloy containing Ag in a range of 20 percent by weight or less or in a range of 70 percent by weight or more with respect to the total amount of Ag and Mg being 100 parts by weight.

Further, the present invention is directed to the organic EL element, wherein the organic EL element is of a top emission type in which the cathode electrode layer is transparent; and the luminescent light is emitted outside through the cathode electrode layer.

Further, the present invention is directed to the organic EL element, in which the cathode electrode layer is formed by sputtering.

Further, the present invention is directed to the organic EL element, in which the electron injection material of the electron injection layer is Li, LiF or CsF.

Further, the present invention is directed to the organic EL element, in which the electron injection layer is arranged in contact with the organic light-emitting portion; and that portion of the organic light-emitting portion which is in contact with the electron injection layer is made of the same material as that of the organic thin film of the electron injection layer.

Further, the present invention is directed to the organic EL element, in which an organic material constituting the organic thin film of the electron injection layer is $Alq_3$.

Further, the present invention is directed to the organic EL element, in which the electron injection layer is formed by bringing a vapor of a matrix organic material for constituting the organic thin film and a vapor of the electron injection material together onto an object to be film-formed.

Moreover, the present invention is directed to an organic EL element-manufacturing method for manufacturing an organic EL element which includes an anode electrode layer, a hole injection layer arranged on the anode electrode layer, a light-emitting layer arranged on the hole injection layer, an electron transport layer arranged on the light-emitting layer, an electron injection layer arranged on the electron transport layer, and a cathode electrode layer arranged on the electron injection layer. In the present invention, when a voltage is applied between the anode electrode layer and the cathode electrode layer and holes and electrons are injected into the light-emitting layer from the hole injection layer and the electron injection layer, the light-emitting layer, emits light and a luminescent light is emitted outside. The present invention is directed to the organic EL element-manufacturing method including emitting a vapor of a matrix organic material having an electron transport property and a vapor of an electron injection material in a vacuum atmosphere, thereby bringing the vapors on a surface of the electron transport layer and forming the electrode injection layer, and forming the cathode electrode layer in contact with the electron injection layer by sputtering.

Further, the present invention is directed to the organic EL element-manufacturing method, in which the cathode electrode layer is formed by sputtering a target of an alloy containing Mg and Ag.

Further, the present invention is directed to the organic EL element-manufacturing method, in which Ag in the alloy target is contained in a range of 20 percent by weight or less or in a range of 70 percent by weight or more with respect to the total amount of Ag and Mg being 100 parts by weight; and the cathode electrode layer is formed as a transparent alloy or the like.

Furthermore, the present invention is directed to the organic EL element-manufacturing method, wherein the organic EL element is formed as a top emission type in which the cathode electrode layer is transparently formed and the luminescent light is emitted outside through the cathode electrode layer.

Further, the present invention is directed to the organic EL element-manufacturing method, in which the electron transport layer is formed by the vapor of the matrix organic material.

The cathode electrode layer composed of the thin film of MgAg and having the good step coverage can be formed on the electrode injection layer.

Since the cathode electrode layer is formed by the sputtering method, the cathode electrode layer is dense and a protective film can be formed on a surface of the cathode electrode layer. In particular, since a SiON film has the transmittance of as high as 95% but with stress that is high, it could not be formed on the surface of the cathode electrode layer by the vapor deposition method. On the other hand, a protective film of an SION film having high stress can be formed on the surface of the cathode electrode layer in the present invention besides the SiN film (transmittance 90%, yellow).

Further, since it is dense, the cathode electrode layer functions as a protective film for preventing the invasion of water.

DETAILED DESCRIPTION OF THE INVENTION

Figure 1:
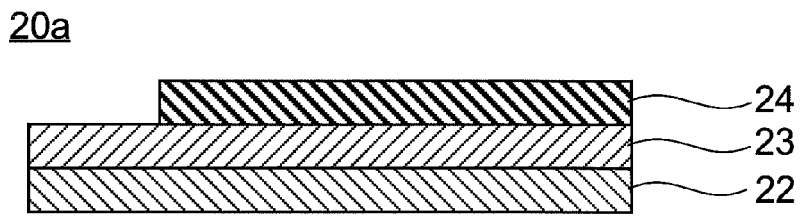
FIGS. 1(a) to (d) are sectional views for illustrating steps of manufacturing the organic EL element of the present invention.
Figure 1:
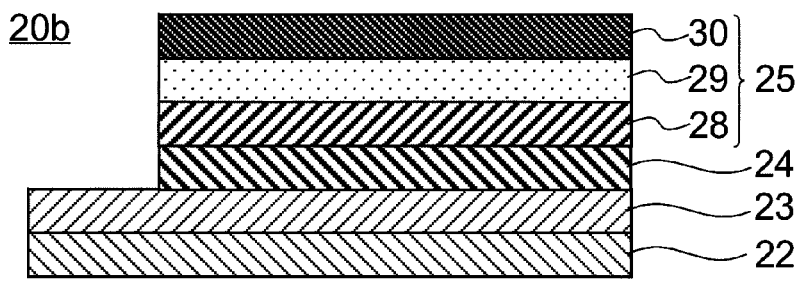
Figure 1:
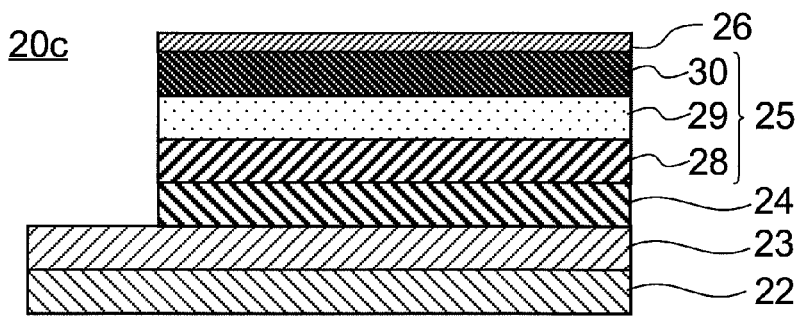
Figure 1:
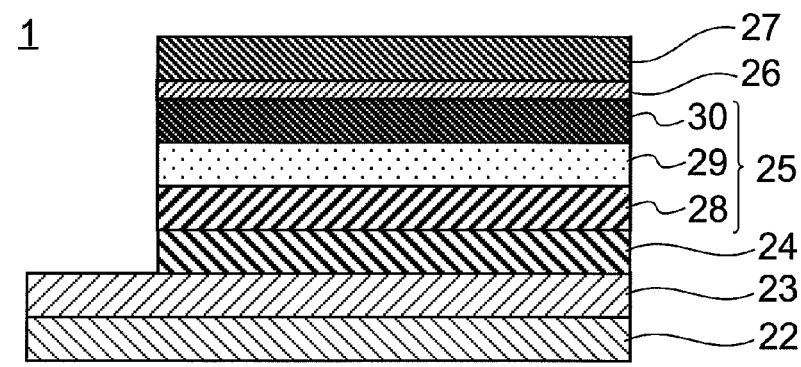

FIG. 1(d) is a sectional view of the organic EL element 1 of the present invention.

This organic EL element 1 has a plate-like substrate 22. An anode electrode layer 23, a hole injection layer 24, an organic light-emitting portion 25, an electron injection layer 26 and a cathode electrode layer 27 are formed on the substrate 22 in this order.

The organic light-emitting portion 25 is constituted by a hole transport layer 28 in contact with the hole injection layer 24, an electron transport layer 30 in contact with the electron injection layer 26, and a light-emitting layer 29 sandwiched between the hole transport layer 28 and the electron transport layer 30. When a positive voltage and a negative electrode are applied to the anode electrode layer 23 and the cathode electrode layer 27, respectively, holes are injected from the hole injection layer 24 into the hole transport layer 28, while electrons are injected from the electron injection layer 26 into the electrode transport layer 30.

The holes and the electrons injected into the hole transport layer 28 and the electron transport layer 30, respectively, move in film thickness directions inside the hole transport layer 28 and the electron transport layer 30, and are recombined inside the light-emitting layer 29, thereby generating a light. The light generated inside the light-emitting layer 29 is emitted into both sides of the electron transport layer 30 and the hole transport layer 28.

This organic EL element 1 is of a top emission type; and the hole injection layer 24, the hole transport layer 28, the light-emitting layer 29, the electron transport layer 30 and the electron injection layer 26 and the cathode electrode layer 27 are transparent with respect to the luminescent light in the light-emitted layer 29. The anode electrode layer 23 is configured so as to reflect the luminescent light of the light-emitting layer 29 at its surface or inside it.

The luminescent light going toward the side of the cathode electrode layer 27 among the luminescent light radiated from the light-emitting layer 29 passes through the electron transport layer 30, the electron injection layer 26 and the cathode electrode layer 27, and is emitted outside. The luminescent light going toward the side of the anode electrode layer 23 is reflected by the anode electrode layer 23, passes through the hole injection layer 24, the organic light-emitting portion 25, the electron injection layer 26 and the cathode electrode layer 27, and is emitted outside.

Next, the steps for manufacturing this organic EL element 1 will be explained.

Figure 2:
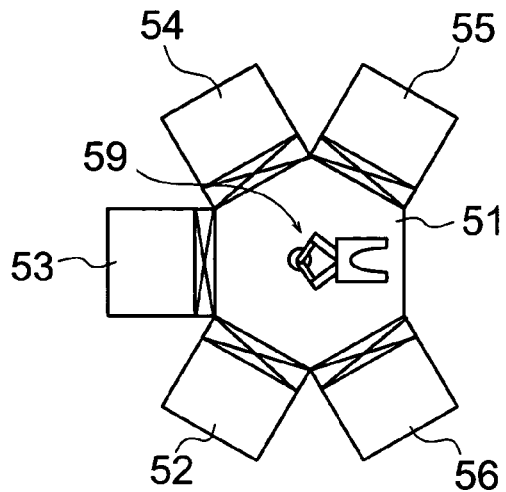
FIG. 2 is one example of a manufacturing apparatus capable of manufacturing the organic EL element of the present invention.

In FIG. 2, a reference numeral 50 denotes a manufacturing apparatus for the organic EL element 1 of the present invention.

This manufacturing apparatus 50 has a transfer chamber 51, a carry-in chamber 52, an organic vapor deposition chamber 53, a vapor co-deposition chamber 54, a sputtering chamber 55 and a carry-out chamber 56. The carry-in chamber 52, the organic vapor deposition chamber 53, the vapor co-deposition chamber 54 and the sputtering chamber 55 are arranged around the transfer chamber 51, and are connected to the transfer chamber 51.

A substrate transfer robot 59 is arranged inside the transfer chamber 51; and the object to be film-formed arranged inside the carry-in chamber 52 is moved into the organic vapor deposition chamber 53, the vapor co-deposition chamber 54, and the sputtering chamber 55 in order; and the organic light-emitting portion 25, the electron injection layer 26 and the cathode electrode layer 27 are formed. Thereafter, the object to be film-formed, in which the cathode electrode layer 27 is formed, is moved into the carry-out chamber 56, and taken out from the carry-out chamber 56 to the atmosphere.

In FIG. 1($a$), a reference numeral 20$a$ denotes the object to be film-formed 20$a$ arranged inside the carry-in chamber 52. In this object to be film-formed 20$a$, an anode electrode layer 23 made of a thin film of a metal (such as, aluminum), and a hole injection layer 24 (such as, an M-HTDATE), having a hole injection property, are preliminarily formed on a substrate 22 of a plate-like glass substrate.

First, the object to be film-formed 20$a$ is carried into the carry-in chamber 52, each of the chambers 51 to 56 being evacuated to vacuum; and the object is carried into the organic vapor deposition chamber 53 from the carry-in chamber 52 by the substrate transfer robot 59; and the hole transport layer 28, the light-emitting layer 29 and the electron transport layer 30 are laminated in this order on the hole injection layer 24 by emitting vapors of organic compounds corresponding to the respective layers 28 to 30 inside the organic vapor deposition chamber 53, thereby forming the organic light-emitting portion 25 on the hole injection layer 24.

In FIG. 1($b$), reference numeral 20$b$ generally denotes the object to be film-formed in which the organic light-emitting portion 25 is formed.

This object to be film-formed 20$b$ is moved from the organic vapor deposition chamber 53 into the vapor co-deposition chamber 54.

Figure 3:
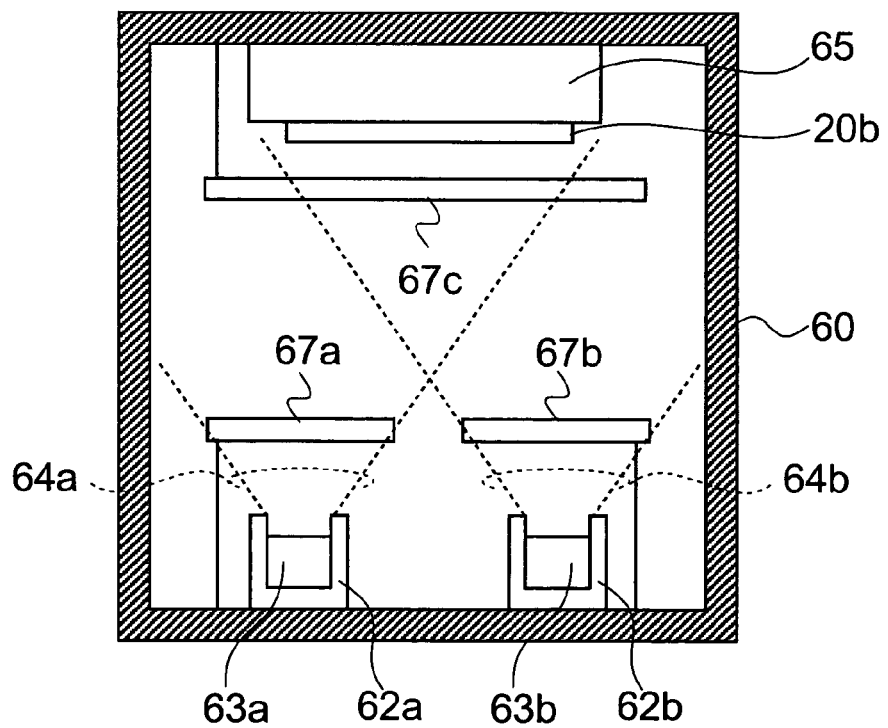
FIG. 3 is an example of a vapor co-deposition device in the manufacturing apparatus.

FIG. 3 is an internally schematic view for illustrating the interior of the vapor co-deposition chamber 54.

The vapor co-deposition chamber 54 has a vacuum chamber 60; and first and second vapor deposition vessels 62$a$, 62$b$ are arranged on a side of a bottom wall of the vacuum chamber 60.

A substrate holder 65 is arranged on a side of a ceiling of the vacuum chamber 60; and the object to be film-formed 20$b$ arranged inside the vapor co-deposition chamber 54 is held on the substrate holder 65, with a surface of the electron transport layer 30, which is a surface of the object to be film-formed, facing toward the first and second vapor deposition vessels 62$a$, 62$b$.

A matrix organic material 63$a$ having an electron transport property and an electron injection material 63$b$ are arranged inside the first and second vapor deposition vessels 62$a$, 62$b$, respectively.

A vapor of the matrix organic material 63$a$ and a vapor of the electron injection material 63$b$ are discharged from the first and second vapor deposition vessels 62$a$, 62$b$; and the vapor of the matrix organic material 63$a$ and the vapor of the electron injection material 63$b$ are brought together onto the object to be film-formed 20$b$ by opening shutters 67$a$ to 67$c$ inside the vacuum chamber 60. As a result, as shown in FIG. 1($c$), on the surface of the electron transport layer 30, an electron injection layer 26 is formed, which is constituted by an organic thin film made of the matrix organic material 63$a$ and electron injection particles made of microparticles of the electron injection material 63$b$ dispersed in the organic thin film. The organic thin film has an electron transport property.

In this example, the matrix organic material 63$a$ is the same organic material as the organic material constituting the electron transport layer 30, so that adhesion between the electron transport layer 30 and the electron injection layer 26 is high; and, in addition, no electrical barrier is formed between the electron transport layer 30 and the organic thin film.

Any of metal, Li, LiF and CsF, is preferable for the electron injection material 63$b$.

Alq$_3$[Tris(8-hydroxyquinoline) aluminum] can be used for the matrix organic material 63$a$.

Figure 5:
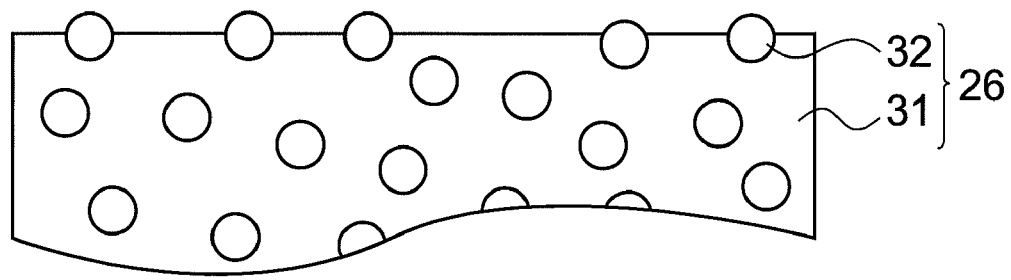
FIG. 5(a) is a view for illustrating a state of electron injection particles dispersed in an organic thin film.
FIG. 5(b) is a view for illustrating a state where a cathode electrode layer and electron injection particles are in contact with each other.
Figure 5:
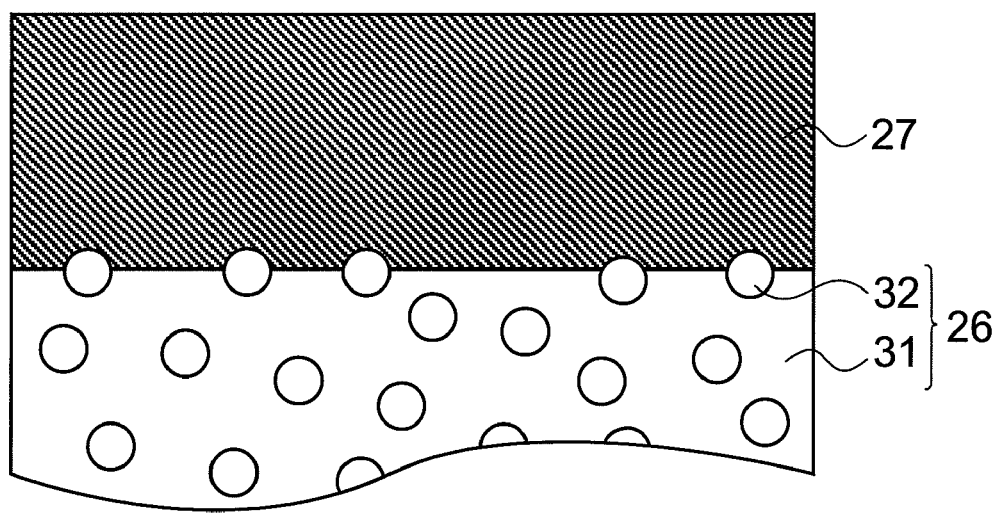
Figure 6:
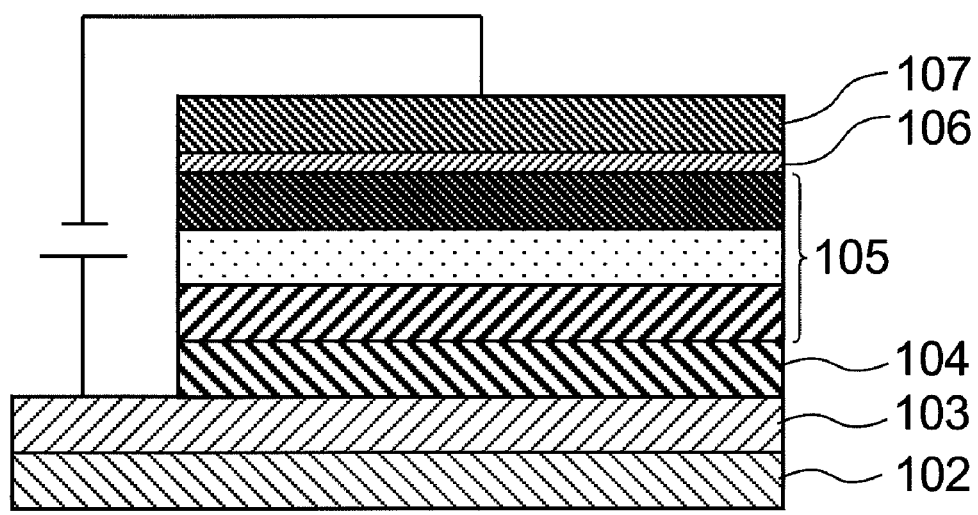
FIG. 6 is a view for illustrating an organic EL element in the conventional art.

FIG. 5($a$) is a schematical sectional view for illustrating the structure of the electron injection layer 26. In the electron injection layer 26 of the present invention, the electron injection particles 32 of the electron injection material are dispersed in the organic thin layer 31, and upper portions of the electron injection particles 32 made of the electron injection material are exposed on the surface of the electron injection layer 26.

The object to be film-formed 20$c$, in which such an electron injection layer 26 is formed, is transferred from the vapor co-deposition chamber 54 into the sputtering chamber 55.

Figure 4:
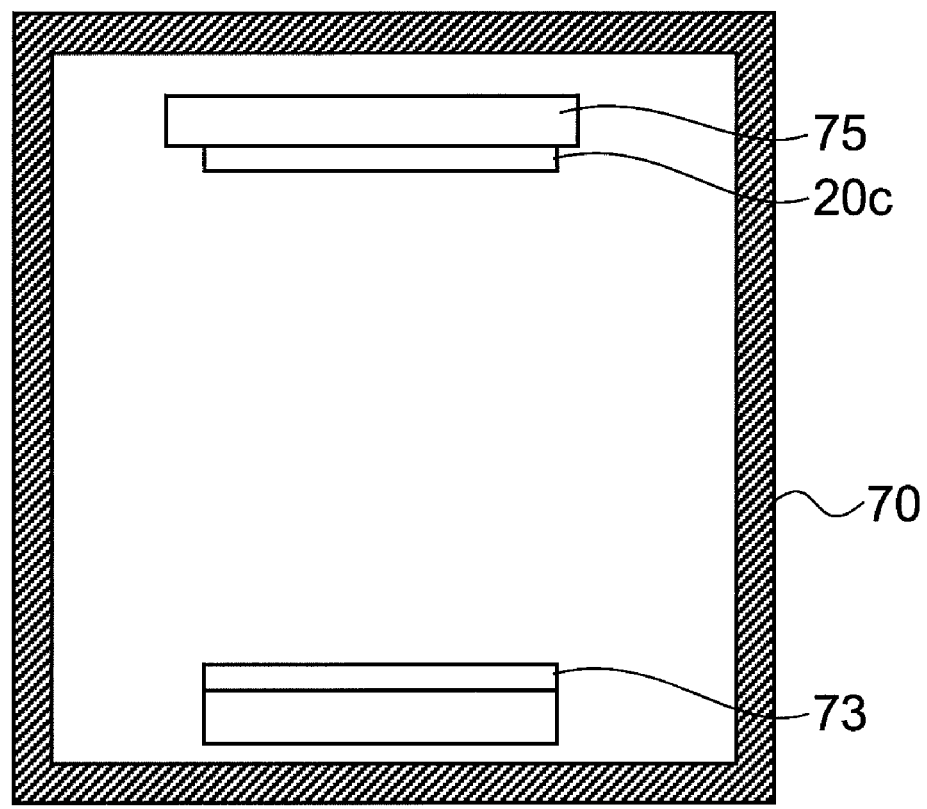
FIG. 4 is an example of a sputtering device in the manufacturing apparatus.

FIG. 4 is a schematical sectional view for illustrating the internal structure of the sputtering chamber 55. The sputtering chamber 55 has a vacuum chamber 70, and an alloy target 73 of an MgAg alloy is arranged inside the vacuum chamber 70.

A substrate holder 75 is arranged at a position faced toward the alloy target 73, and the object to be film-formed 20$c$ carried into the sputtering chamber 55 is held on the substrate holder 75, with the exposed surface of the electron injection layer 26 being faced toward the alloy target 73.

The alloy target 73 is a sintered body of Mg and Ag; and in order to obtain formability and denseness usable as a sputtering target, Ag is contained in a range of 20 percent by weight or less or 70 percent by weight or more with respect to the total amount of Ag and Mg being 100 parts by weight.

A surface of the electron injection layer 26 is exposed at the surface of the object to be film-formed 20$c$. When the alloy target 73 is sputtered, as shown in FIG. 1($d$), the cathode electrode layer 27 made of an MgAg film having the same composition as that of the MgAg of the target is formed on the surface of the electron injection layer 26, thereby obtaining the organic EL element 1.

The cathode electrode layer 27 is in contact with the electron injection particles 32 having the upper portions exposed onto the organic thin film 31, so that the cathode electrode layer 27 and the electron injection particles 32 are connected to each other. Lower portions of the electron injection particles 32 are implanted in the organic thin film 31, so that even if the sputtered particles of the MgAg target collide with the electron injection particles 32, the electron injection particles 32 do not peel from the organic thin film 31.

In addition, since the cathode electrode layer 27 is formed by the sputtering method, wirings formed of the cathode electrode layer 27 are not broken even if a step exists on the surface.

The organic EL element 1, in which the cathode electrode layer 27 is formed, is taken outside from the carry-out chamber 56.

The lower portions of the electron injection particles 32 are in contact with the organic thin film 31, and the organic thin film 31 has the electron transport property, so that when a voltage, which makes the cathode electrode layer 27 to be a negative voltage, is applied between the anode electrode layer 23 and the cathode electrode layer 27, electrons are injected into the organic thin film 31 through an interface between the electron injection particles 32 and the organic thin film 31. These electrons and the holes injected from the anode electrode layer 23 are recombined inside the light-emitting layer 29, whereby the light-emitting layer 29 generates a light.

Figure 7:
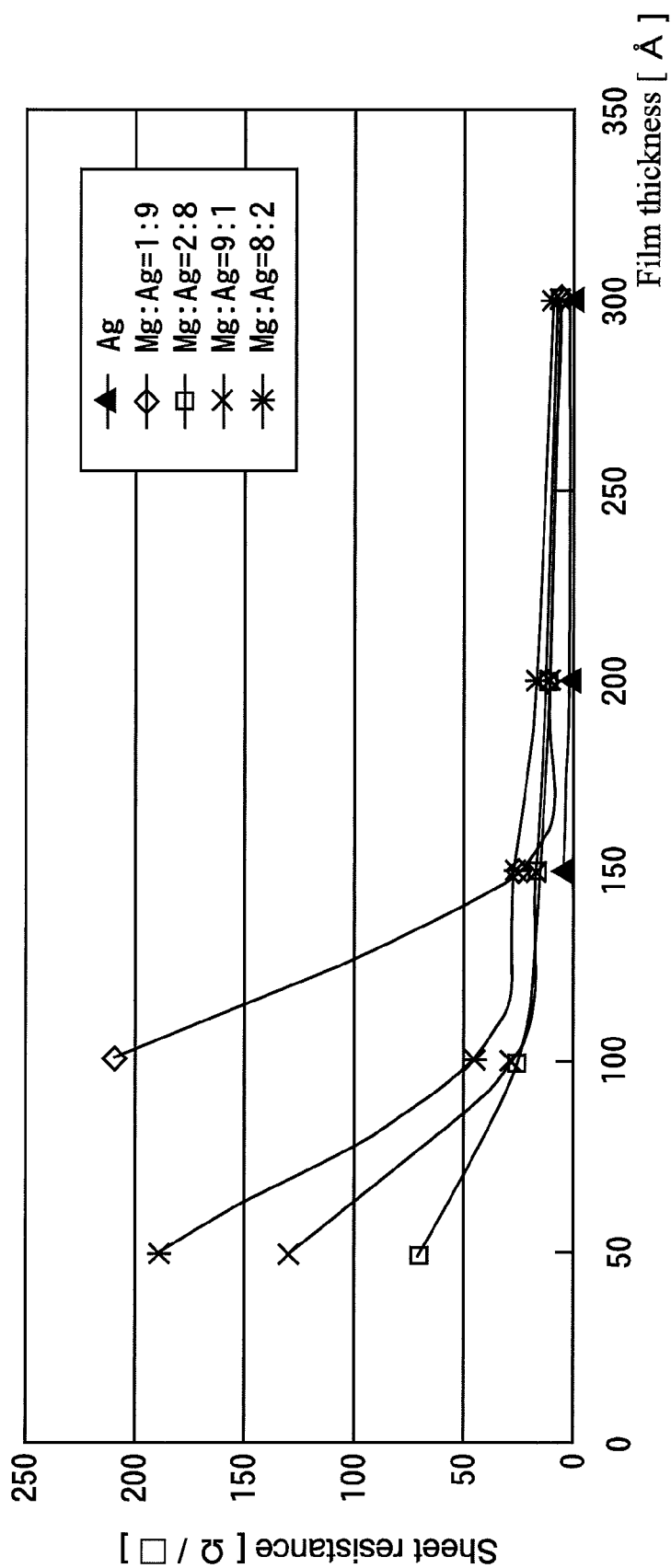
FIG. 7 is a graph for showing the relationship between the composition and the thickness of the cathode electrode layer and the sheet resistance.

The relationship among the composition and the film thickness of the cathode electrode layer 27 and the sheet resistance value is shown in a graph in FIG. 7. The compositions are shown at weight ratio of Mg:Ag=9:1 to 1:9, as well as Ag=100% as a reference value.

It is found that since the sheet resistance value is required to be 50Ω/□ or less, the film thickness is desirably 150 Å or more in the range of 9:1 to 1:9, and may be in a range of 100 Å or more in a range of 9:1 to 2:8.

Figure 8:
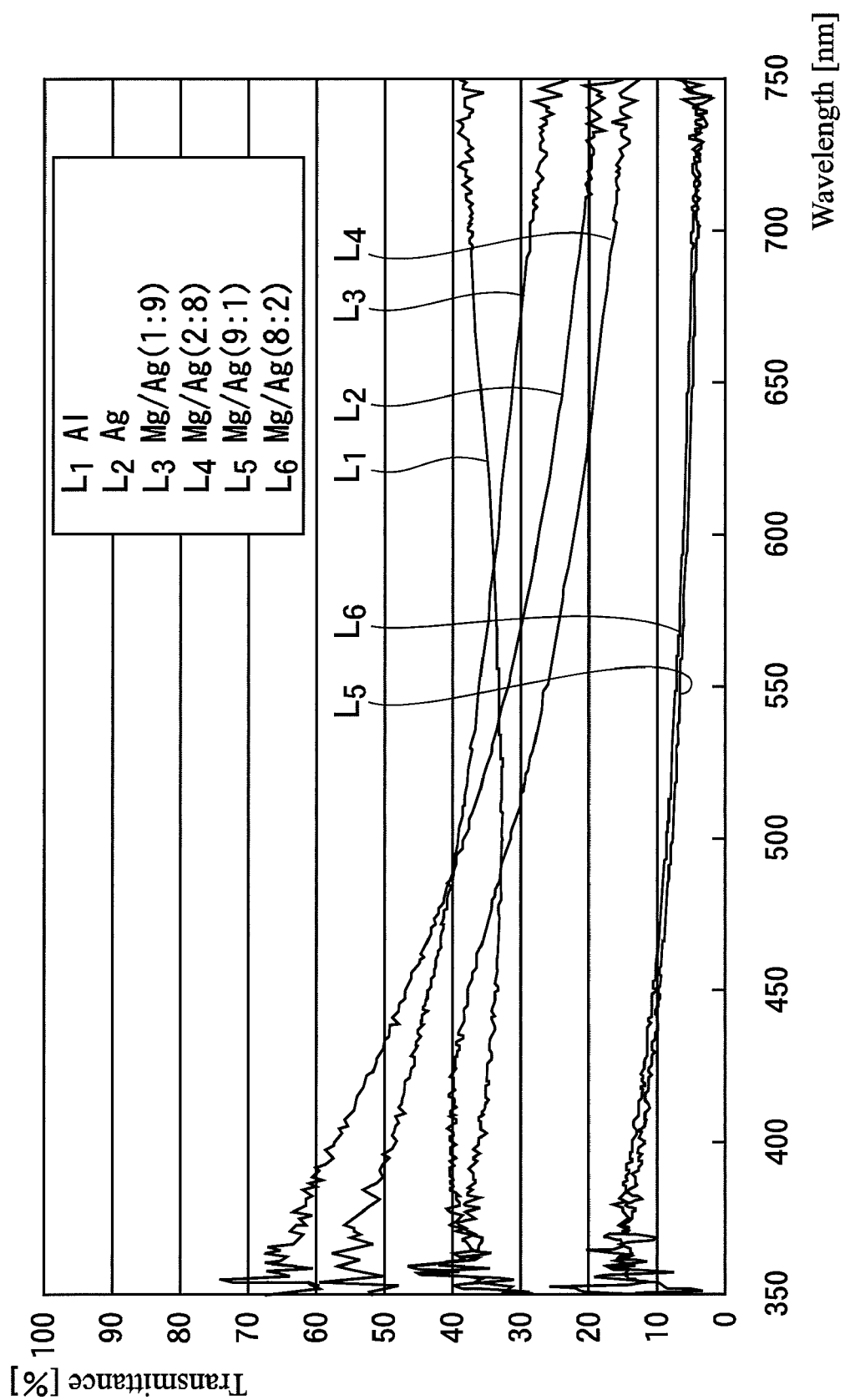
FIG. 8 is a graph for showing the relationship between the wavelength and the transmittance with regard to the composition of the cathode electrode layer.

Next, the relationship between the composition and the transmittance of the cathode electrode layer 27 is shown in a graph in FIG. 8. The film thickness is 200 Å, and for comparison, the transmittances of the cathode electrode layer in a case of Al being 100% and of a cathode electrode layer in a case of Ag being 100% are also shown. When Ag is 20 percent by weight or less ($L_5$, $L_6$), the transmittances are low.

Figure 9:
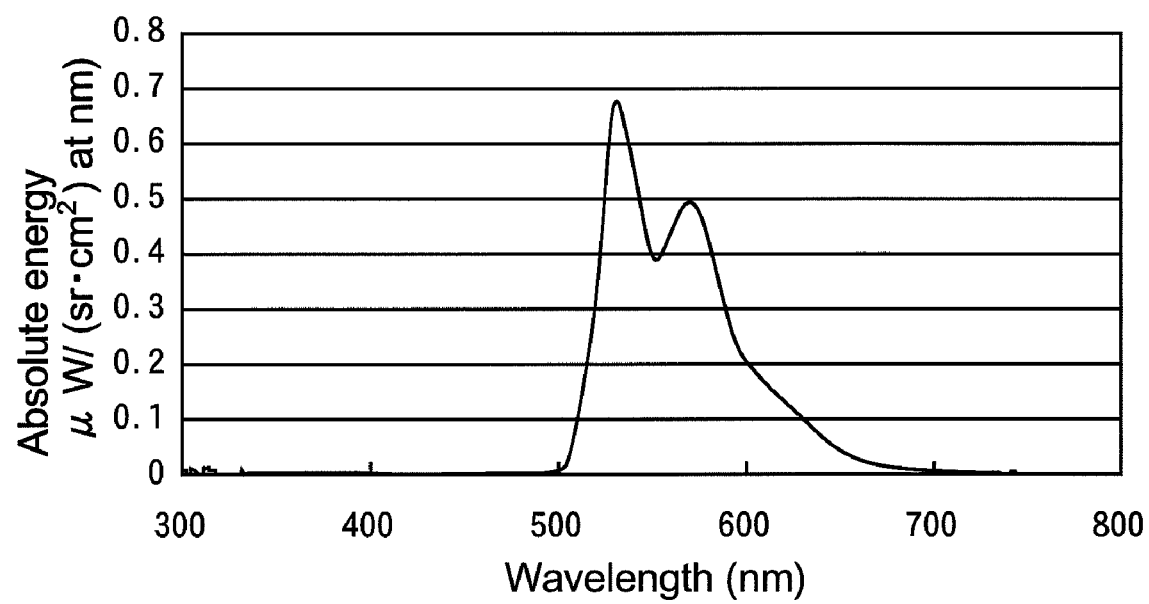
FIG. 9 is a light emission spectrum diagram of an EL element of the present invention having a green light-emitting layer.

FIG. 9 shows the emission wavelength of the organic EL element 1 in which a green light-emitting material was contained in the light-emitting layer 29 and a cathode electrode layer having the weight ratio of Mg:Ag being 2:8 was formed on an electron injection layer containing 2 percent by weight of Li in an organic thin film of $Alq_3$ by the sputtering method.

Figure 10:
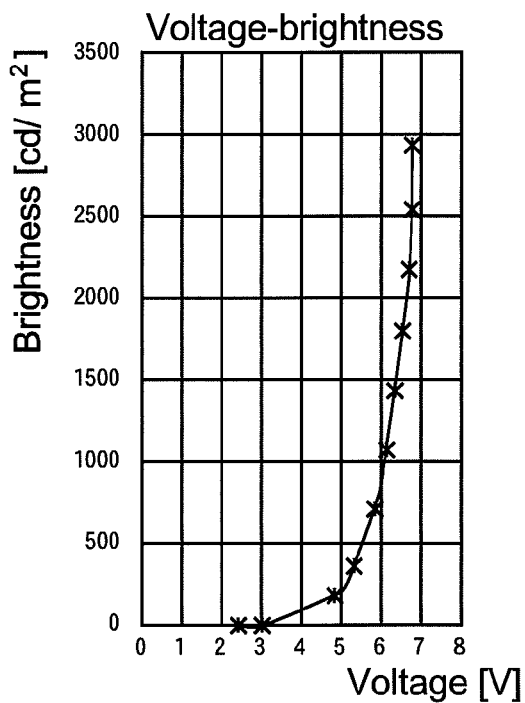
FIG. 10(a) is the voltage-brightness characteristics.
FIG. 10(b) is the voltage-current density characteristics.
FIG. 10(c) is the current density-brightness characteristics.
FIG. 10(d) is the current density-efficiency characteristics.
Figure 10:
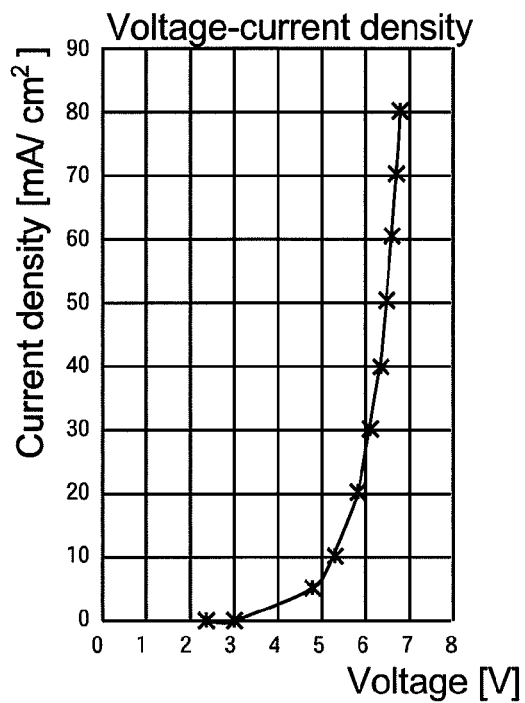
Figure 10:
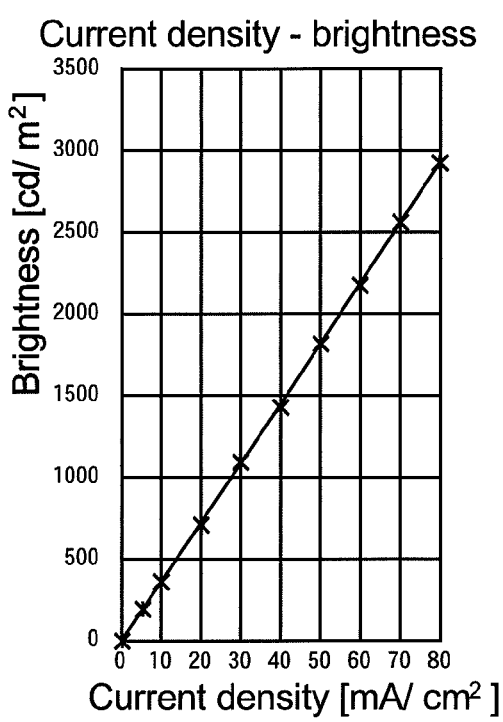
Figure 10:
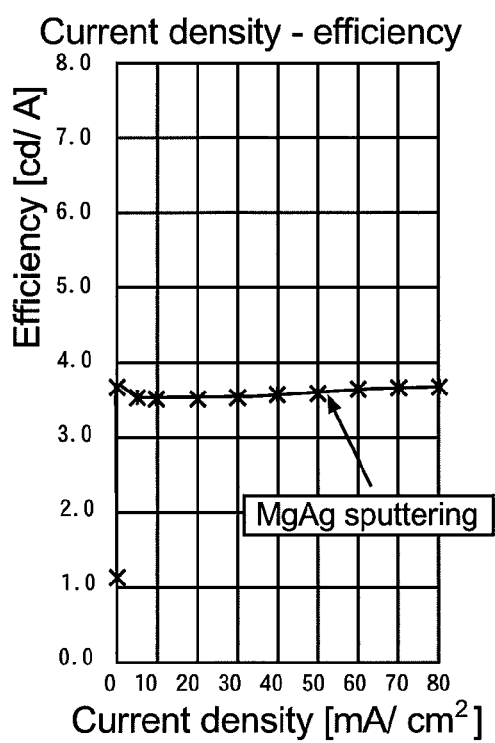

FIG. 10($a$) is a graph for showing the voltage-brightness characteristics of the organic EL element 1; FIG. 10($b$) is a graph for showing the voltage-current density characteristics; FIG. 10($c$) is a graph for showing the current density-brightness characteristics; and FIG. 10($d$) is a graph for showing the current density-efficiency characteristics.

Any of the characteristics in the organic EL element 1 formed by sputtering method exhibit practical characteristics, and the characteristics thereof not inferior to those in the vapor deposition method.

Meanwhile, when the electron injection layer 26 is formed, the content rate of the electron injection particles 32 may be constant in the film thickness direction of the electron injection layer 26, or it may be that the content rate thereof is smaller in a position nearer to the electron transport layer 30, while the content rate thereof is greater in a position nearer to the cathode electrode layer 27. When the content rate thereof is constant, the electron injection particles can be contained by a few percent by weight. It is confirmed that when Li is contained by 2 percent by weight or more, the efficiency of the luminescent light is high.

What is claimed is:

1. An organic EL element-manufacturing method for manufacturing an organic EL element which includes an anode electrode layer, a hole injection layer arranged on the anode electrode layer, a light-emitting layer arranged on the hole injection layer, an electron transport layer arranged on the light-emitting layer, an electron injection layer arranged on the electron transport layer, and a cathode electrode layer arranged on the electron injection layer, wherein when a voltage is applied between the anode electrode layer and the cathode electrode layer and holes and electrons are injected into the light-emitting layer from the hole injection layer and the electron injection layer, the light-emitting layer emits light and a luminescent light is emitted outside, the organic EL element-manufacturing method, comprising:

a step of forming the electron injection layer on a surface of which upper portions of electron injection particles are exposed by emitting a vapor of a matrix organic material having an electron transport property and a vapor of an electron injection material in a vacuum atmosphere, bringing the vapors on a surface of the electron transport layer and dispersing the particles of the electron injection material in the matrix organic material; and a sputtering step of forming the cathode electrode layer in contact with the electron injection layer by sputtering, wherein lower portions of the electron injection particles are implanted in the matrix organic material so that, even if the cathode electrode layer is formed in the sputtering step, the electron injection particles do not peel.

2. The organic EL element-manufacturing method according to claim 1, wherein the cathode electrode layer is formed by sputtering a target of an alloy containing Mg and Ag.

3. The organic EL element-manufacturing method according to claim 2, wherein Ag in the alloy target is contained in a range of at most 20 percent by weight or in a range of at least 70 percent by weight with respect to the total amount of Ag and Mg being 100parts by weight, and the cathode electrode layer is formed as a substantially transparent alloy.

4. The organic EL element-manufacturing method according to claim 3, wherein the organic EL element is formed as a top emission type in which the cathode electrode layer is transparently formed and the luminescent light is emitted outside through the cathode electrode layer.

5. The organic EL element-manufacturing method according to claim 1, wherein the electron transport layer is formed by the vapor of the matrix organic material.

* * * * *